United States Patent
Kneissl

(10) Patent No.: US 7,751,455 B2
(45) Date of Patent: Jul. 6, 2010

(54) BLUE AND GREEN LASER DIODES WITH GALLIUM NITRIDE OR INDIUM GALLIUM NITRIDE CLADDING LASER STRUCTURE

(75) Inventor: Michael A. Kneissl, Berlin (DE)

(73) Assignee: Palo Alto Research Center Incorporated, Palo Alto, CA (US)

( * ) Notice: Subject to any disclaimer, the term of this patent is extended or adjusted under 35 U.S.C. 154(b) by 733 days.

(21) Appl. No.: 11/262,272

(22) Filed: Oct. 28, 2005

(65) Prior Publication Data

US 2006/0126688 A1   Jun. 15, 2006

Related U.S. Application Data

(60) Provisional application No. 60/636,205, filed on Dec. 14, 2004.

(51) Int. Cl.
*H01S 5/00*    (2006.01)
(52) U.S. Cl. .............. 372/45.01; 372/43.01; 372/44.01; 372/46.01
(58) Field of Classification Search .............. 372/43.01, 372/44.01, 45.01, 46.01
See application file for complete search history.

(56) References Cited

U.S. PATENT DOCUMENTS

| | | | |
|---|---|---|---|
| 5,793,054 A * | 8/1998 | Nido | 257/18 |
| 6,345,063 B1 * | 2/2002 | Bour et al. | 372/45.01 |
| 6,526,083 B1 | 2/2003 | Kneissl et al. | |
| 6,833,564 B2 * | 12/2004 | Shen et al. | 257/94 |
| 2003/0064538 A1 | 4/2003 | Fujimoto | |
| 2003/0116767 A1 * | 6/2003 | Kneissl et al. | 257/79 |
| 2003/0136970 A1 | 7/2003 | Takeya et al. | |
| 2004/0184496 A1 | 9/2004 | Kneissl et al. | |
| 2004/0184497 A1 | 9/2004 | Kneissl et al. | |

* cited by examiner

*Primary Examiner*—Minsun Harvey
*Assistant Examiner*—Yuanda Zhang
(74) *Attorney, Agent, or Firm*—Jonathan A. Small

(57) ABSTRACT

A novel indium gallium nitride laser diode is described. The laser uses indium in either the waveguide layers and/or the cladding layers. It has been found that InGaN waveguide or cladding layers enhance optical confinement with very small losses. Furthermore, the use of InGaN waveguide or cladding layers can improve the structural integrity of active region epilayers because of reduced lattice mismatch between waveguide layers and the active region.

5 Claims, 13 Drawing Sheets

GREEN $IN_{0.3}Ga_{0.7}N/In_{0.2}Ga_{0.8}N$ MULTIPLE QUANTUM WELL LASER HETEROSTRUCTURE ON A CONDUCTIVE SUBSTRATE.

InGaN MULTIPLE QUANTUM WELL ACTIVE REGION 304 FOR A 460nm BLUE LASER.

BLUE AND GREEN LASER DIODES WITH GALLIUM NITRIDE OR INDIUM GALLIUM NITRIDE CLADDING LASER STRUCTURE

CROSS-REFERENCE TO RELATED APPLICATIONS

This application claims the benefit of Provisional Patent Application No. 60/636,205, filed Dec. 14, 2004 which is hereby incorporated by reference in its entirety.

BACKGROUND

Laser diodes are used in many applications such as laser printing, optical data storage, and optical fiber communications. Laser diode structures usually include a central waveguide/quantum well "active" region flanked by upper and lower cladding layers. The active region or "core" includes multiple quantum well structures that together form a high optical gain region where lasing occurs. An upper cladding layer above the core and a lower cladding layer below the core have refractive indexes lower than the core refractive index. The cladding lower refractive indexes form a waveguide effect that contains the optical modes in the core. The guided optical modes propagate along the active region creating a laser light beam that emanates from the laser structure.

One method of creating the index of refraction differential that confines a transverse optical mode in the active region utilizes a GaN waveguide layer and an AlGaN cladding layers. Conventional III-V compound nitride lasers often use either a short period AlGaN/GaN superlattice layer or a bulk AlGaN layer doped with Mg as an upper cladding layer. However, the large lattice mismatch between GaN and AlN limits the maximum thickness and alloy composition of an AlGaN cladding layer. The alloy composition limits prevent large refractive index differentials between cladding layer and active region. Reduced refractive index differentials adversely affects optical confinement.

Besides guiding optical modes, a second objective of cladding layer design is to facilitate electrical current flow through the laser structure. In order to facilitate current flow through the laser, the cladding layer is typically doped. Magnesium is often used to p-dop the AlGaN alloy cladding layer. However, high hole concentrations are difficult to achieve because increasing the AlN mole fraction of the AlGaN alloy increases the ionization energy of the Mg acceptors. Low hole concentration result in high device resistance and increased Joule heating during device operation.

Eliminating Aluminum in cladding layers avoids the Mg and Al conflict. However, eliminating aluminum results in GaN:Mg cladding structures that provide weak optical mode confinement and allows transverse optical mode penetration into a p-metal layer that serves as an electrical contact. Absorption loses for a p-metal is expected to be greater than 100 per centimeter, even for a laser structure with a 700 nm thick GaN:Mg cladding layer. Such high modal losses significantly exceed the distributed loss in a conventional laser and lead to an increase in threshold current for the laser. Very high modal losses can quench laser operation.

Thus an improved method or material for confining the optical modes is needed.

SUMMARY

An indium gallium nitride semiconductor laser is described. The indium gallium nitride laser includes an active region having two sides. At least one of the two sides is adjacent to a group III-V nitride waveguide layer that includes indium.

DETAILED DESCRIPTION

An improved multiple quantum well laser emitting in the blue or green wavelength spectrum is described. The described structure includes at least one group III-V nitride waveguide or cladding layer that includes indium. Adding indium to the cladding or waveguide layer reduces the lattice mismatch between the waveguide and the multiple quantum well active region. Adding indium to the waveguide layer also enhances the electrical and/or optical confinement in the active region.

InGaN waveguides are particularly suitable for longer wavelength lasers because the quantum wells in blue and green wavelength laser active regions usually have high indium contents. The design is particularly suitable for quantum well structures having an indium content exceeding 15%. Blue semiconductor lasers emitting around 460 nm wavelength light typically have an approximately 20% indium concentration in the quantum wells. Green semiconductor lasers emitting about 520 nm wavelength light typically have around 30% indium concentrations in the quantum well (see also FIG. 9).

Figure 1:
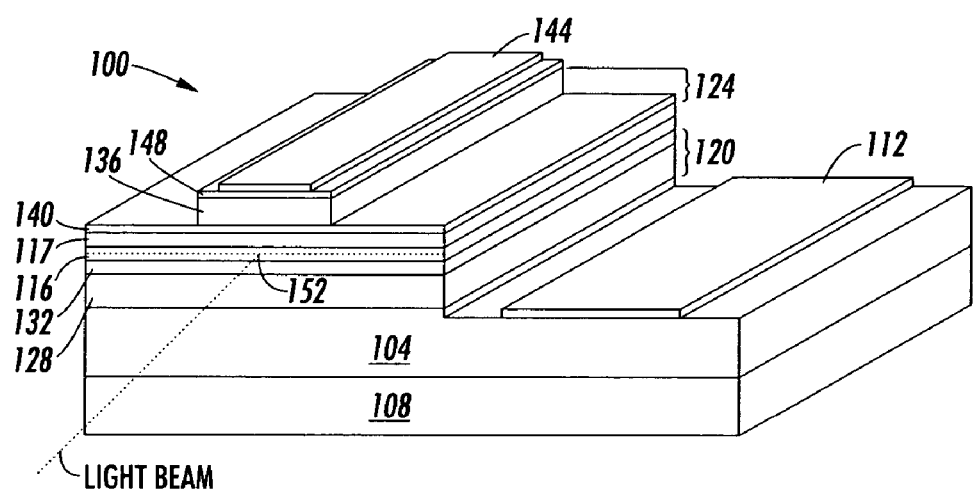
FIG. 1 shows an example indium gallium nitride ridge-waveguide laser diode.

FIG. 1 shows an example InGaN multiple quantum well ridge guide laser diode 100. The structure 100 includes an n doped layer 104, such as silicon doped gallium nitride (GaN:Si) formed over substrate 108. The thickness of the silicon doped gallium nitride layer ranges between 1 to 20 microns and is typically 5 microns. Substrate 108 is usually a material with a wurtzite crystalline structure. Examples of typical substrates include sapphire ($Al_2O_3$), silicon carbide (SiC), zinc oxide (ZnO), Aluminum Nitride (AlN) and Gallium nitride (GaN) among other materials. An n-type electrode 112 provides an electrical contact (e.g. titanium-Aluminum (Ti/Al) or Titanium-gold (Ti/AU).

Figure 9:
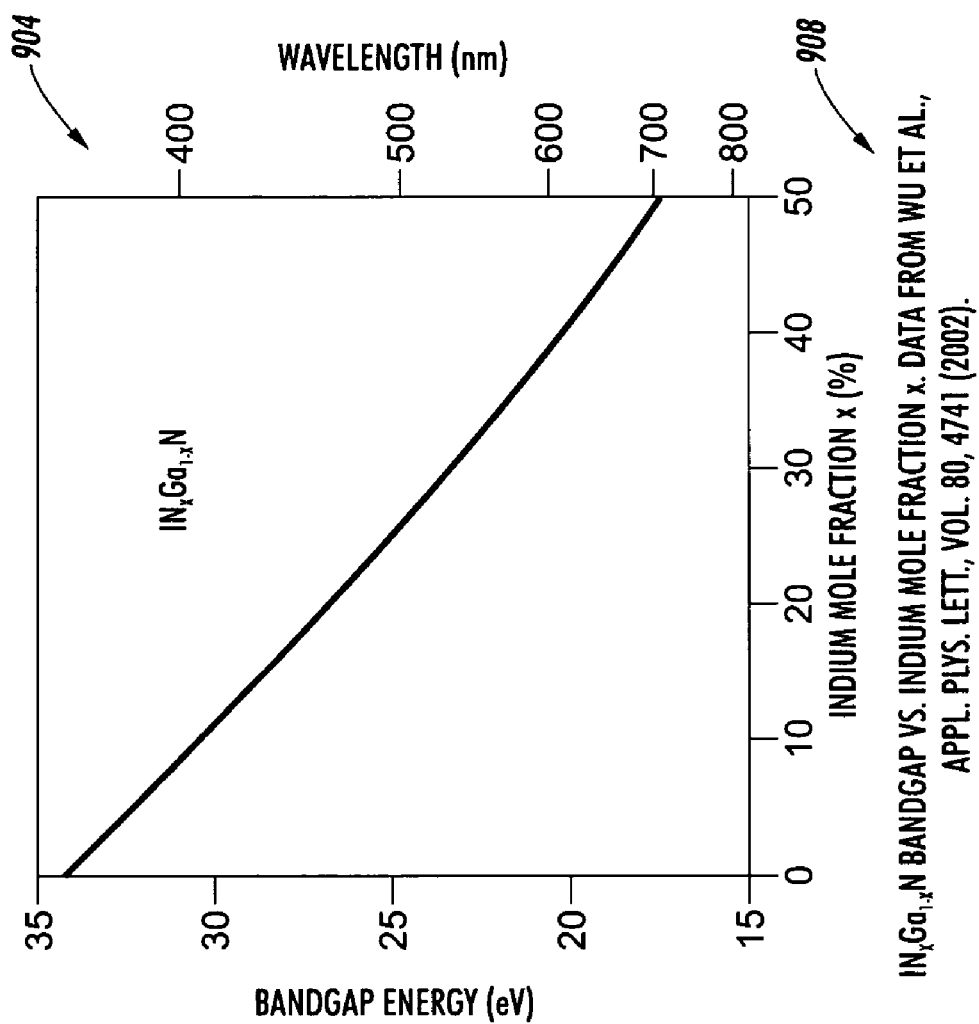
FIG. 9 shows the $In_xGa_{1-x}N$ bandgap in a laser active region (and hence the laser wavelength output) as a function of vs. the indium mole fraction x.

The lasing portion of the laser diode includes an InGaN single or multiple quantum well active region 116. Active region 116 typically includes several InGaN quantum wells separated by GaN or InGaN barrier layers. Each quantum well is typically between 2 nm and 10 nm thick. The barrier layers separating adjacent quantum wells are typically between 2 nm and 30 nm thick. Indium content in the wells may vary, although typical indium content for a violet 400 nm laser may be around 10%, a blue 460 nm laser may be around 20%, and for a 520 nm green laser, the indium content may be around 30%. Of course it is possible to incorporate even more indium into the QW, which would enable even longer emission wavelength.904 FIG. 9 provides a curve that shows the approximate laser wavelength output along axis 904 as a function of indium mole fraction in the quantum well plotted on axis 908. The figure is taken from Wu et al., Applied physics Letters, Vol. 80 p. 4741 (2002).

A magnesium doped aluminum gallium nitride (AlGaN:Mg) current confinement layer 117 is grown on top of the single or multiple quantum well active region 116. The aluminum mole fraction of the p-doped aluminum gallium nitride current confinement layer 117 is typically in the range of 10-30% for violet laser diodes emitting near 400 nm. The thickness of the of the example p-doped aluminum gallium nitride current confinement layer is normally in the ranges from 5 nm to 50 nm, and is typically around 20 nm.

Optical confinement layers 120 and 124 flank active region 116. Confinement layer 120 includes an n-doped cladding layer 128 and an n-doped waveguide layer 132. In one prior art implementation, the n-doped cladding layer 128 includes silicon doped aluminum-gallium nitride (AlGaN:Si) while the n-doped waveguide layer 132 might include n-doped gallium nitride (GaN:Si). The aluminum mole fraction of the n-doped aluminum-gallium nitride cladding layer 128 is typically in the range of 5-15% for violet laser diodes emitting near 400 nm. The thickness of the example cladding layer 128 is typically ranges from 500 nm to 2000 nm, and typically is around 1000 nm. The thickness of the n-doped gallium nitride waveguide layer 132 usually ranges from 50 nm to 200 nm, and often is 100 nm.

Opposing optical confinement layer 124 is typically p-doped. Confinement layer 124 includes a p-doped cladding layer 136 and a p-doped waveguide layer 140. In the prior art, the p-doped cladding layer 136 often includes magnesium doped aluminum nitride (AlGaN:Mg) while the p-doped waveguide layer 140 might include p-doped gallium nitride (GaN:Mg). The aluminum mole fraction of the p-doped aluminum gallium nitride cladding layer 136 is typically in the range of 5-15% for violet laser diodes emitting near 400 nm. The example cladding layer 136 thickness typically ranges from 500 nm to 2000 nm, and is typically 500 nm. The example waveguide layer 140 thickness typically ranges from 50 nm to 200 nm, and is typically 80 nm.

An electrode 144 is formed over confinement layer 124. Electrode 144 structure should be compatible with confinement layer 124 doping structure. An example p-electrode 144 material is a Ni/Au bilayer formed over a p-doped gallium nitride (GaN:Mg) contact layer 148.

During operation, a voltage potential is applied to n-electrode 112 and p-electrode 144. Holes are injected through p doped confinement layer 124 and electrons injected through n-doped confinement layer 120. The electrons and holes combine in the active region to produce a highly coherent laser beam which emanates from area 152 on the laser diode face.

Optical confinement layers 120, 124 confine the optical signal primarily to active region 116. Optical confinement depends on forming the active region 116 from a highest index of refraction of material, the waveguide layers 132, 140 from a lower index of refraction material, and the cladding layers 128, 136 from the lowest index of refraction materials. (Intervening current confinement layers, such as a Mg-doped AlGaN current-confinement layer usually have lower index of refraction, and are close to the active region. Such current confinement layer are undesirable from an optical confinement point of view because the layers distort the transverse optical mode. However, the layers are useful for electronic confinement. Fortunately the current confinement layer is very thin, such that the distortion of the transverse optical mode in the laser is relatively small.) In general, a larger index of refraction differential between adjacent materials (such as active region 115 and waveguide layer 132 and cladding layer 128) results in superior optical confinement.

Figure 10:
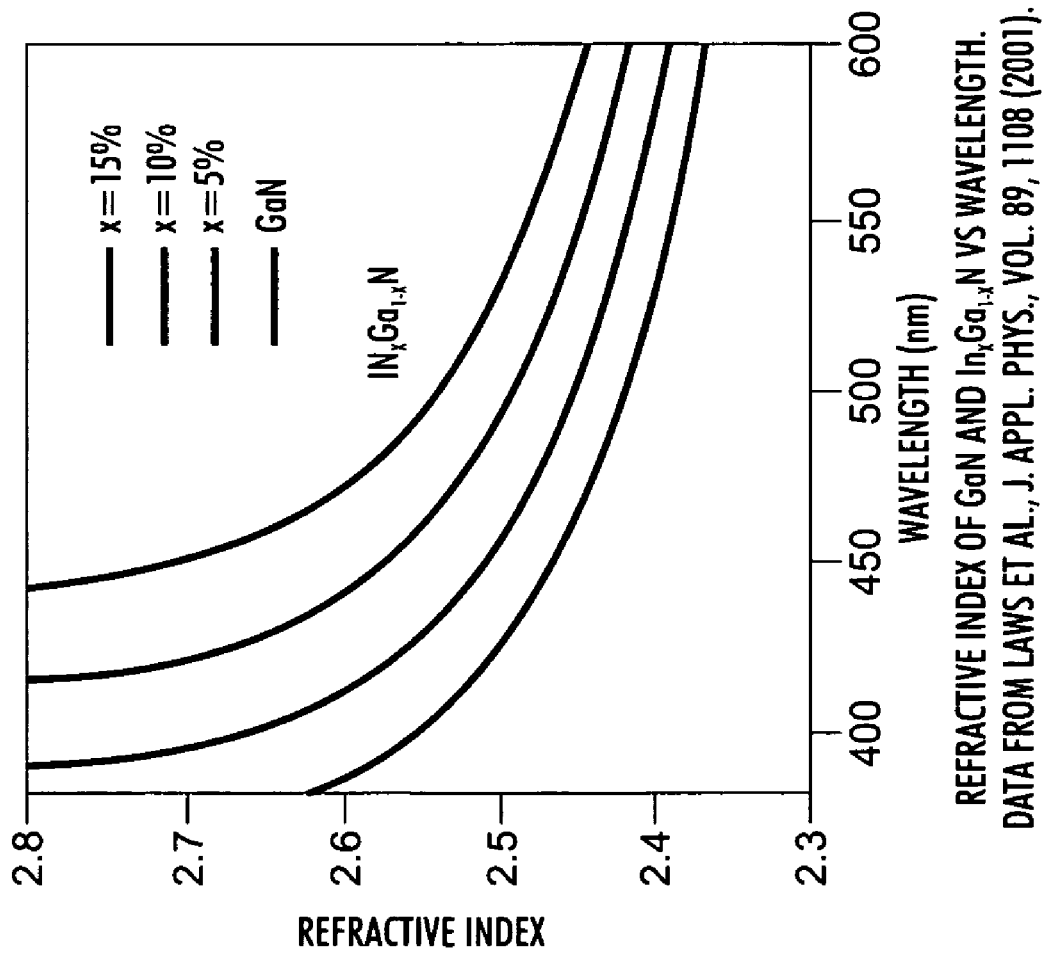
FIG. 10 shows the refractive index of GaN and $In_xGa_{1-x}N$ as a function of wavelength.
Figure 11:
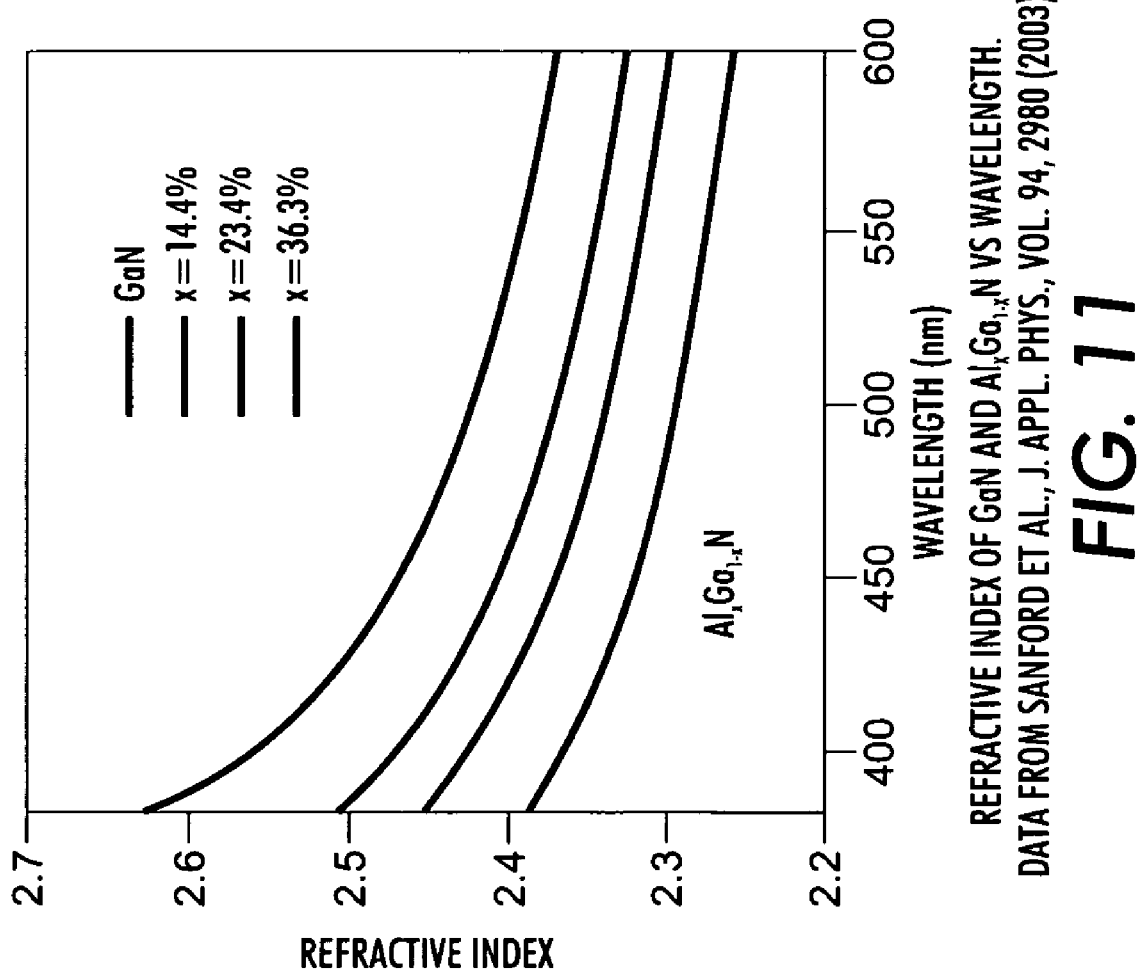
FIG. 11 shows the refractive index of GaN and $Al_xGa_{1-x}N$ as a function of wavelength.

FIGS. 10 and 11 provide graphs that show the refractive indices of GaN, AlGaN and InGaN materials for different wavelength and aluminum and indium composition. The data was obtained from Laws et al., J. Appl. Phys., Vol. 89, 1108 (2001) and Sanford et al., J. Appl. Phys., Vol. 94, 2980 (2003).

Figure 2:
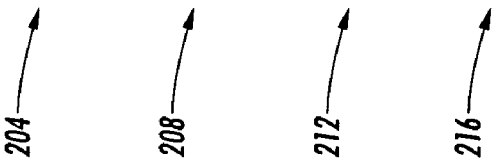
FIG. 2, shows the transverse mode confinement factors and modal loss that result from different structures in a 400 nm (violet) laser.

FIG. 2 is a table that shows the confinement resulting from different materials in the optical confinement layers. In FIG. 2 computations, only the absorption in the p-metal electrode 144 is accounted for, all other layers in the laser structure are assumed to be loss-free. The table also assumes a 400 nm (violet) laser output based on a laser structure as shown in FIG. 1.

Row 200 of FIG. 2, provides typical losses in a conventional structure using a 500 nm thick p-$Al_xGa_{1-x}N$ (x=8%) cladding layer. In the conventional structure, the confinement factor is approximately 1.01% per quantum well in a 3 quantum well device. The loss is the laser structure is approximately 2 per centimeter. However, as described in the background, a higher aluminum concentration in the cladding increases the ionization energy of Mg acceptors in the AlGaN:Mg thereby substantially increasing series resistance and device heating. Furthermore, AlGaN layers grown on GaN are under tensile stress, which limits the maximum aluminum content and thickness of these layers.

In order to avoid increased resistance and cracking due to tensile stressed AlGaN layers, rows 204, 208, 212 show the optical confinement using a GaN:Mg cladding structure without aluminum. Rows 204 shows the effect of a thicker (700 nm) cladding while row 208 shows the results when a thinner (350 nm) cladding is used. Both thicknesses still result in losses substantially higher than the conventional aluminum containing cladding structure. Row 216 shows that the results improve when the thicker 700 nm cladding of row 208 is used with a longer wavelength (460 nm) blue laser. Although the longer wavelength improves the laser loss characteristics in row 216, the loss is still substantially higher than conventional laser losses and the losses are sufficient to significantly impair laser operation.

One way to avoid aluminum in the optical confinement layers is to substitute indium. Blue and green wavelength indium lasers typically include a high indium concentration in the active region. Typical quantum well indium concentrations for a blue 460 nm laser may be around 20% and for a green 520 nm laser, around 30%. By alloying at least one of the waveguide layers 132, 140 of FIG. 1 with an indium concentration below that of the quantum well indium concentration, the optical confinement results shown in FIG. 2 can be substantially improved.

Figure 3:
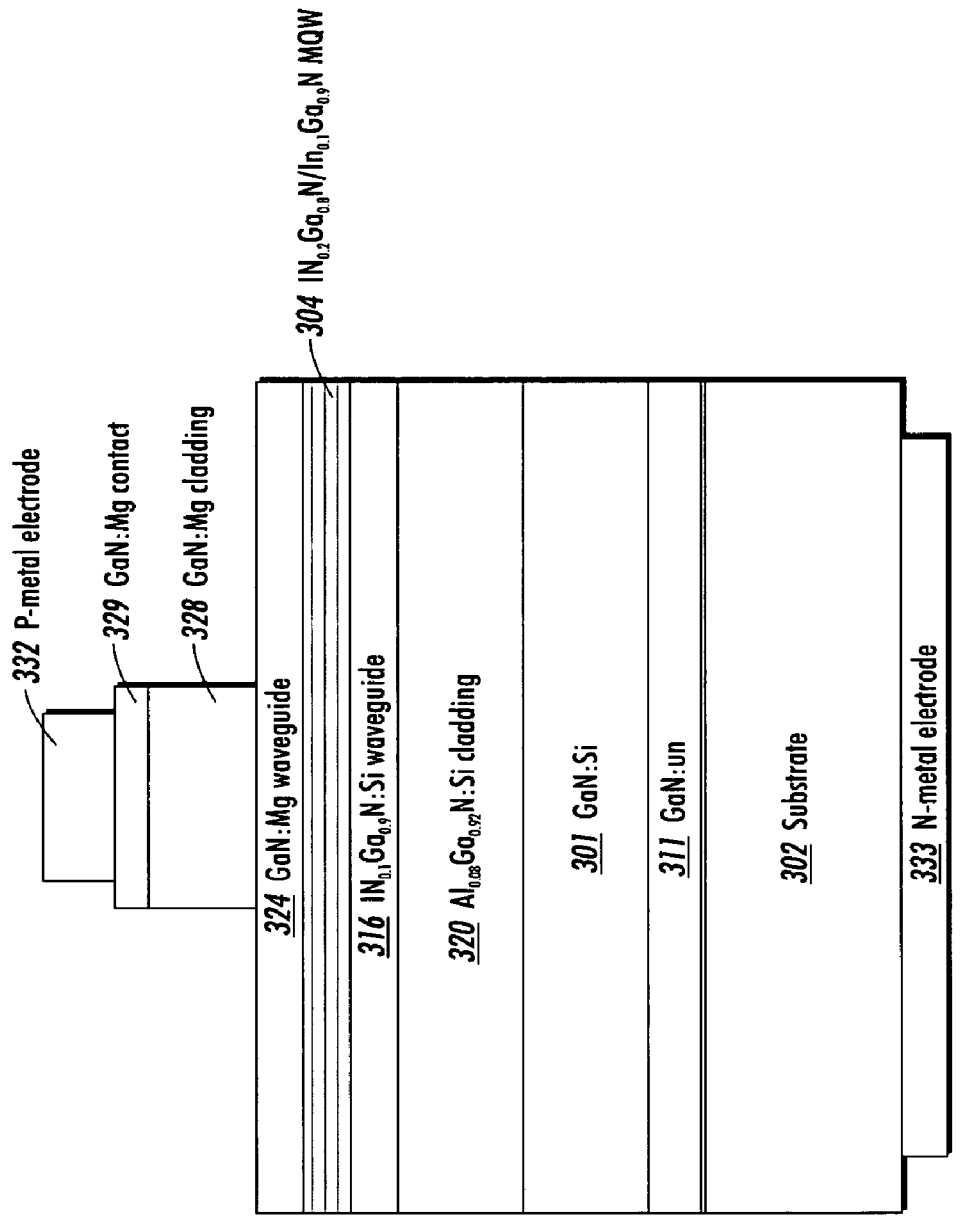
FIG. 3 shows a cross sectional face view of one embodiment of an asymmetric stacked InGaN laser structure
Figure 4:
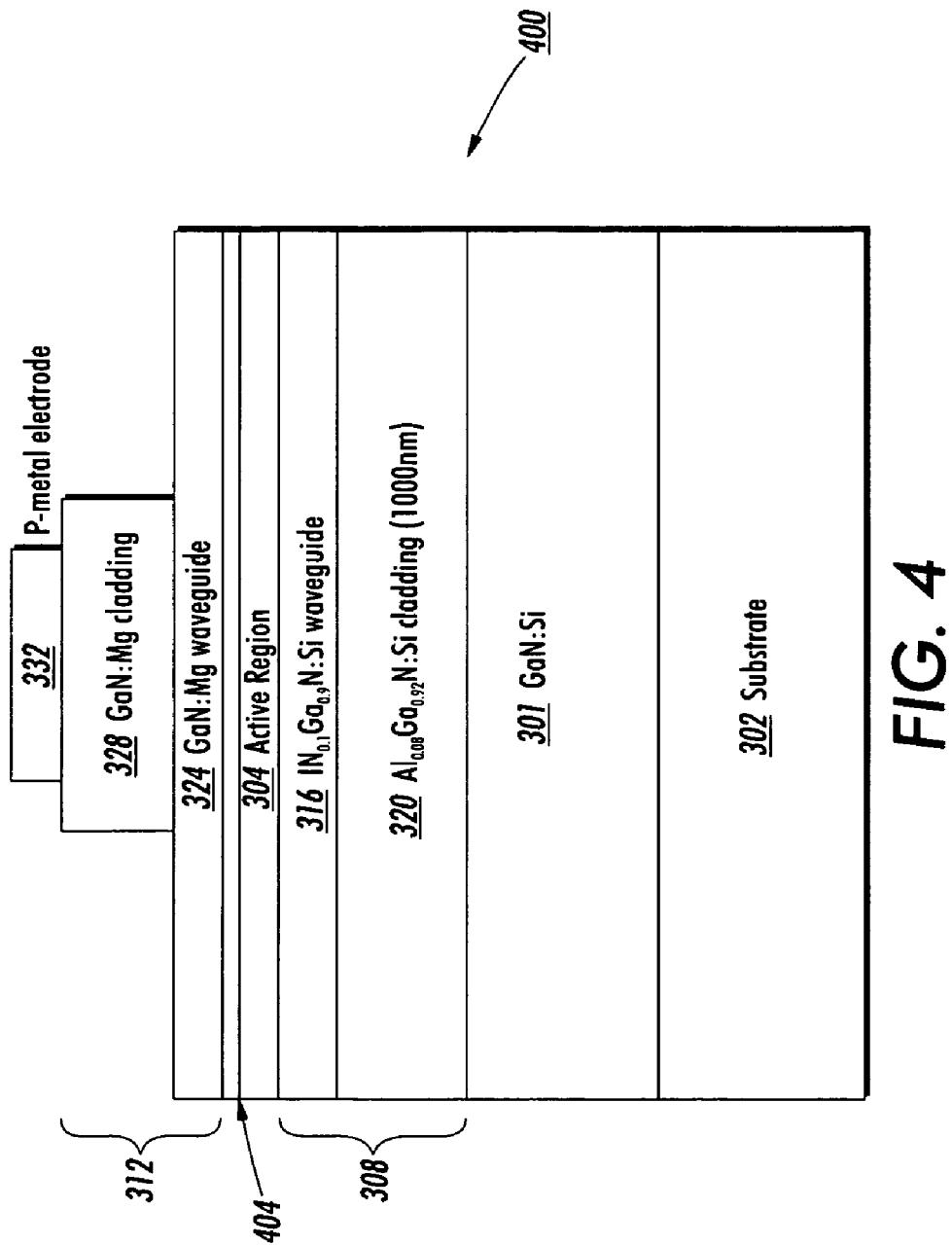
FIG. 4 shows a cross sectional face view of an asymmetric stacked InGaN laser structure including a current blocking layer or "tunnel barrier layer".
Figure 5:
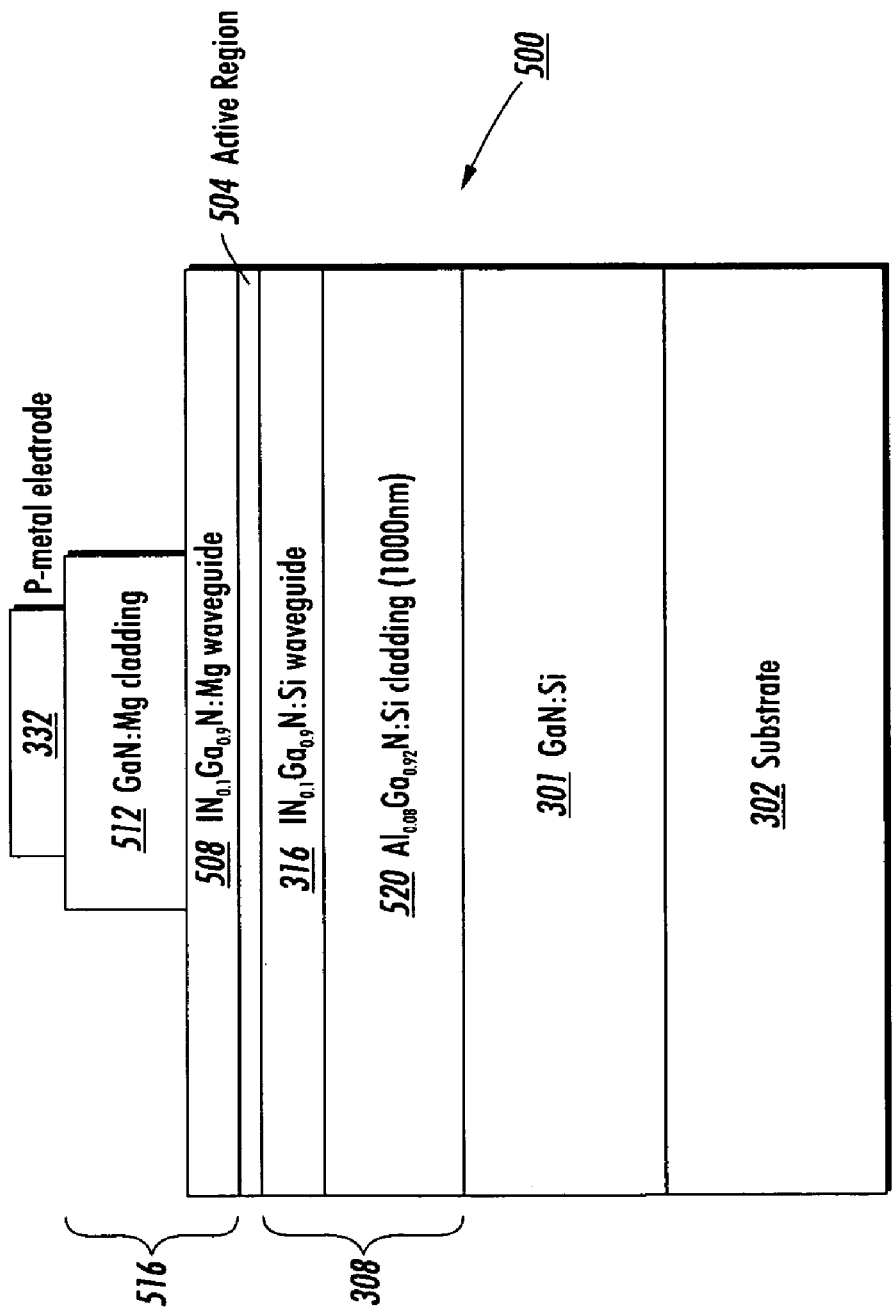
FIG. 5 shows a cross sectional face view of one embodiment of a symmetric stacked InGaN laser structure.

FIGS. 3 to 8 shows cross sectional face views of different InGaN laser embodiments that include indium gallium nitride in at least one of the an optical confinement layers. In particular, FIG. 3 to 8 shows face views of stacking laser heterostructures that may be substituted for the stacked conventional heterostructure region 150 of FIG. 1. FIG. 3 to FIG. 5 show modification of the waveguide layers while FIG. 6 and FIG. 7 focus on cladding layer modifications. FIG. 9 shows the optical confinement and loss characteristics of the implementations shown in FIGS. 3 through 8.

FIG. 3 shows one embodiment of an asymmetric stacked InGaN laser structure 300 formed over an n-doped GaN layer 301 and a substrate 302. Laser structure 300 includes an InGaN multiple quantum well active region 304 that outputs blue laser light at 460 nm. Active region 304 includes one or several $In_{0.2}Ga_{0.8}N$ quantum wells such as $In_{0.2}Ga_{0.8}N$/$In_{0.1}Ga_{0.9}N$ layers. $In_{0.1}Ga_{0.9}N$ barrier layers separate adjacent quantum wells. A lower optical confinement layer 308 and an upper optical confinement layer 312 flanks the two sides of active region 304.

FIG. 3 shows one exemplary embodiment of the cross-sectional structure of the III-V nitride laser device. The layer structure 300 may be fabricated using metal-organic chemical vapor deposition (MOCVD) or molecular beam epitaxy (MBE) or hydride vapor phase epitaxy (HVPE). The III-V nitride laser device 300 is grown, for example, on a c-face (0001) or an a-face (1120) or an r-face (0112) oriented sapphire ($Al_2O_3$) substrate 302 on which successive semiconductor layers are deposited. Other example substrate materials include silicon carbide (e.g., 6H—SiC or 4H—SiC), GaN, AlGaN or AlN, ZnO, $ScAlMgO_4$ or silicon.

In various exemplary embodiments, the substrate wafer 302 is of standard specifications, including an epitaxial polish on one side and a typical thickness of about 0.25 mm to about 1 mm. The substrate temperatures during gallium nitride, aluminum gallium nitride and indium gallium nitride layer growth is typically between about 500° C. and about 1200° C. In addition, the reactor pressure may be controlled between about 40 Torr and about 1500 Torr. An organometallic precursors for the MOCVD growth, such as TMGa (trimethylgallium), TMAl (trimethylaluminum), TMIn (trimethylindium) and TEGa (triethylgallium) may be used for the group III elements. Ammonia ($NH_3$)) serves as an example of a suitable nitrogen source. Hydrogen and/or nitrogen may be used as carrier gases for the organometallic precursor gases. For the n-doping, 100 ppm $SiH_4$ is diluted in H2. Examples of n-type dopants include, but are not limited to, Si, O, Se, and Te. For the p-type doping, $Cp_2Mg$ (cyclopentadienylmagnesium) is used. Examples of p-type dopants include, but are not limited to, Mg, Ca, C and Be.

In case of sapphire, SiC, ZnO or silicon substrate, a low-temperature nucleation layer 311 [REM: see revised drawing of FIG. 3] is typically first deposited. The nucleation layer can be GaN, InGaN, AlGaN or AlN and is typically 10-30 nm thick and deposited at a temperature of 400 C-800 C. It is also possible to deposit a high temperature AlN or AlGaN nucleation layer on sapphire or SiC. The nucleation layer is typically 100-1000 nm thick and deposited at a temperature of 1000 C-1300 C. Homoepitaxial growth on AlN, AlGaN or GaN substrate does normally not utilize such a nucleation layer and growth can be directly initiated with layer 301.

A first III-V nitride layer 301 is formed on or over the substrate 302. The first III-V nitride layer 301 is an n type GaN or InGaN silicon doped buffer layer. In the current example, where the buffer layer serves as a current spreading layer. In various exemplary embodiments, the first III-V nitride layer 301 has an n-doping concentration in the range between about $10^{16}$ to about $10^{20}$ $cm^{-3}$. More typically, the doping concentration is about $5 \times 10^{18}$ $cm^{-3}$. In such exemplary embodiments, the first III-V nitride layer 301 has a thickness from about 1 micron to about 10 micron.

A second III-V nitride layer 320 is formed on or over the first III-V nitride layer 301. The second III-V nitride layer 320 serves as a first cladding layer 320. In various exemplary embodiments, the second III-V nitride cladding layer 320 is an silicon doped, n type AlGaN cladding layer. The refractive index of cladding layer 320 is typically smaller than the refractive index of a third III-V nitride layer that serves as a waveguide layer 316 (waveguide). In various exemplary embodiments, the aluminum content of the AlGaN cladding layer 320 is about 0% to about 16%. The AlGaN cladding layer 320 typically has an n doping concentration of about $10^{16}$ to about $10^{20}$ cm-3. In various exemplary embodiments, the doping concentration is about $1 \times 10^{18}$ $cm^{-3}$. The second III-V nitride cladding layer 320 has a thickness from about 0.2 micron to about 2 micron.

The third III-V nitride layer 316 serves as a first waveguide layer, 316. Waveguide layer 316 is formed on or over the second III-V nitride cladding layer 320. In various exemplary embodiments, the third III-V nitride waveguide layer 316 is an n-type InGaN:Si layer in which the indium content is chosen such that the refractive index of the third III-V nitride waveguide layer 316 refractive index is larger than that of the second III-V nitride cladding layer 320 and is smaller than that of an indium gallium nitride quantum well in an active region 304. In various exemplary embodiments, the waveguide layer 316 indium content is about 5% to about 15%, and in some exemplary embodiments sometimes is about 10%. In various exemplary embodiments, the thickness of the third III-V nitride waveguide layer 316 ranges from about 50 nm to about 200 nm, and has an n doping concentration of about $10^{16}$ to about $10^{20}$ cm-3. In various exemplary embodiments, the doping concentration of the third III-V nitride waveguide layer 316 is about $1 \times 10^{17}$ $cm^{-3}$.

The quantum well active layer 304 is formed on or over the third III-V nitride waveguide layer 316. In various exemplary embodiments, the quantum well active layer 304 is formed using a single or multiple indium gallium nitride quantum well. In various exemplary embodiments, the quantum well may have a thickness from about 10 Å to about 200 Å. The indium gallium nitride quantum well 304 is typically un-doped. However, in some alternate embodiments, the indium gallium nitride quantum well is Si doped or partially Si doped. When doped, typical Si doping concentrations are between about $10^{16}$ to about $10^{20}$ $cm^{-3}$. In one embodiment, an example Si doping concentration is about $5 \times 10^{18}$ $cm^{-3}$. It should be appreciated that, in general, the composition of the indium gallium nitride quantum well 304 composition is chosen such that the quantum well band gap energy is smaller than the band gap energy of the waveguide layer 361 and cladding layers 316 and 320. The actual indium content of the quantum well can vary and depends on the targeted emission wavelength. One exemplary embodiment of a quantum well active region 304 for example, a laser emitting at 460 nm contains a InGaN quantum well with an indium content of about 20%. Another exemplary embodiment of a quantum well active region 304 for a laser emitting at 520 nm might contains an InGaN quantum wells with an indium content of about 30%.

Figure 13:
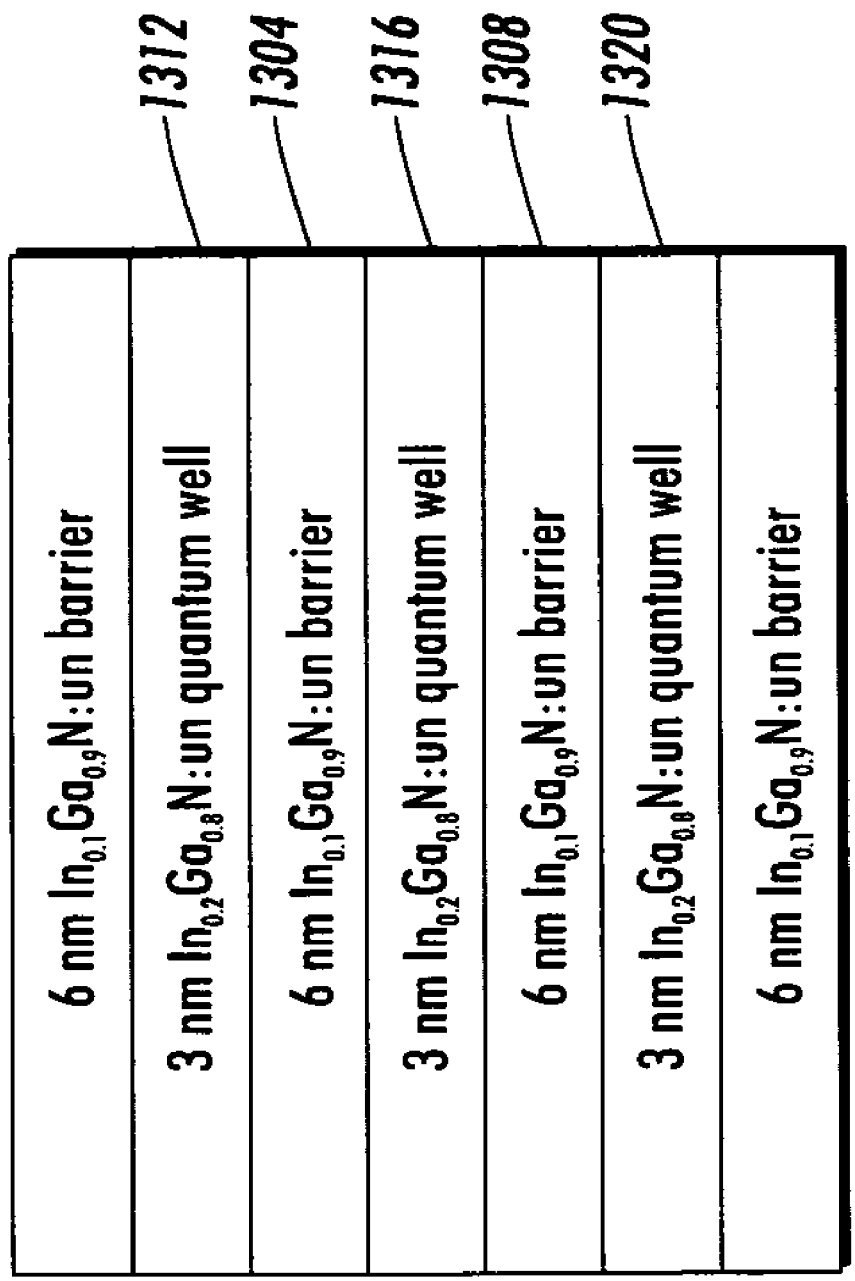
FIG. 13 shows an expanded view of an active region for a blue laser showing individual quantum wells separated by barrier layers.

GaN or InGaN barrier layers separate the InGaN quantum wells. FIG. 13 shows an expanded view of the barrier layers and adjacent InGaN quantum wells. The barrier layers 1304, 1308 separating adjacent quantum wells 1312, 1316, 1320 are typically between 2 nm and 30 nm thick. The indium content in the barriers may vary, although typical indium content for a blue 460 nm laser may be between 0-10%, and for a 520 nm green laser, the indium content may be between 0-20%. The indium gallium nitride barrier layers are typically un-doped. However, in some embodiments, the indium gallium nitride barrier is Si doped or partially Si doped. When doped, typical Si doping concentrations are between about $10^{16}$ to about $10^{20}$ cm$^{-3}$. In various exemplary embodiments, the Si doping concentration is about $5\times10^{18}$ cm-3.

A fourth III-V nitride layer 324 is formed on or over the MQW active region 304. The fourth III-V nitride layer 324 acts as a second waveguide layer 324. In various exemplary embodiments, the fourth III-V nitride second waveguide layer 324 is a magnesium-doped gallium nitride or indium gallium nitride material. [REM: labeled wrong in the draft FIG. 3+4]. In such exemplary embodiments, the indium content is chosen such that the refractive index of the fourth III-V nitride second waveguide layer 324 is smaller than the refractive index of the indium gallium nitride quantum well active region 304. In various exemplary embodiments, the indium contents of the fourth III-V (In)GaN second waveguide layer is about 0% to about 15%, and in some exemplary embodiments, is usually about 0%. In various exemplary embodiments, the thickness of the fourth III-V nitride second waveguide layer 324 ranges from about 50 to 200 nm and the fourth III-V nitride second waveguide layer 324 has a p-doping concentration of about $10^{16}$ to about $10^{20}$ cm$^{-3}$. In various exemplary embodiments, the Mg-doping concentration is about $1\times10^9$ cm$^{-3}$.

A fifth III-V nitride layer 328 is formed on or over the fourth III-V nitride second waveguide layer 324. The fifth III-V nitride layer 328 is serves as a second cladding layer 328. In various exemplary embodiments, the fifth III-V nitride second cladding layer 328 is a p type gallium nitride cladding layer. In various exemplary embodiments, the fifth III-V nitride second cladding layer 328 has a thickness that typically ranges from about 200 nm to 2000 nm. In various exemplary embodiments, the fifth layer III-V nitride second cladding layer 328 may be formed using Mg-doped gallium nitride. In various exemplary embodiments, the fifth cladding layer 328 has an Mg-doping concentration of about $10^{16}$ to about $10^{21}$ cm$^{-3}$. In various exemplary embodiments, the typical doping concentration is about $5\times10^{19}$ cm$^{-3}$.

In the example of FIG. 3, a final sixth III-V nitride layer 329 is formed on or over the fifth III-V nitride second cladding layer 328. The III-V nitride layer 329 is a highly Mg-doped gallium nitride layer 329 to lower the contact resistance between the p-type semiconductor layers and the metal electrode contact. In various exemplary embodiments, the III-V nitride layer 329 contact layer has a thickness of from between about 2 nm and about 200 nm. The final low resistance contact layer 329 has a Mg-doping concentration from about $10^{16}$ to about $10^{21}$ cm$^{-3}$; and typically in various exemplary embodiments, the Mg-doping concentration is about $1\times10^{20}$ cm$^{-3}$.

On top of the final III-V nitride layer 329 a ohmic p-metal electrode 332 is formed over contact layer 329. In various exemplary embodiments, the p-metal layer can be formed using nickel (Ni), palladium (Pd), platinum (Pt), a nickel-gold alloy Ni/Au, a palladium/titanium/gold alloy (Pd/Ti/Au), or a platinum/titanium/gold alloy (Pt/Ti/Au), which are deposited by thermal or e-beam evaporation or sputtering. The p-metal contacts may then be annealed to reduce the contact resistance, e.g. at a temperature of 500-600 degrees Celsius for typically 3-20 minutes in nitrogen, oxygen or dry air.

The n-metal electrode may be either formed laterally (see layer 112 in FIG. 1) or, in case when the substrate is electrically conductive, the n-metal electrode can be formed on the backside of the substrate (see FIG. 3). In FIG. 3, the n-electrode metal layer 333 is deposited on the backside of the conductive substrate. In various exemplary embodiments, the n-metal layer 333 is deposited by thermal or e-beam evaporation or sputter deposition. The n-metal contact may be an alloy of titanium/aluminum (Ti/Al), titanium/gold (Ti/Au), titanium/aluminum/platinum/gold (Ti/Al/Pt/Au) or titanium/aluminum/molybdenum/gold (Ti/Al/Mo/Au). The n-metal contact may then be annealed to reduce the contact resistance, e.g. at a temperature of 500-600 degrees Celsius for typically 3-20 minutes in nitrogen, oxygen, or dry air.

Lower optical confinement layer 308 includes a lower waveguide layer 316 and a lower cladding layer 320. Lower waveguide layer 316 includes indium in a concentration below that of the quantum wells in the active region 304. As an example, the lower waveguide layer 316 composition has a 10 percent Indium concentration and the lower waveguide layer 316 is n doped with silicon to form a 100 nm thick $In_{0.1}Ga_{0.9}N$:Si layer. Lower waveguide 316 is formed over a lower cladding layer 320. In one embodiment, lower cladding layer 320 may be made up of a 1000 nm thick silicon doped AlGaN layer such as $Al_{0.08}Ga_{0.92}N$:Si.

Upper optical confinement layer 312 is formed from a p-doped structure such as a magnesium-doped structure. Upper optical confinement layer 312 usually includes an upper waveguide layer 324 and an upper cladding layer 328. In one implementation, upper waveguide layer 324 includes a 100 nm thick GaN:Mg layer. An approximately 500 nm thick GaN:Mg cladding layer 328 is formed over upper cladding layer 328.

During laser operation, current flows from P-metal electrode 332 through the optical confinement layers. The current induces lasing in active region 304. The different waveguide compositions in the n-doped waveguide layer 316 and the p-doped upper waveguide layer 324 produces an asymmetric laser structure.

Figure 8:
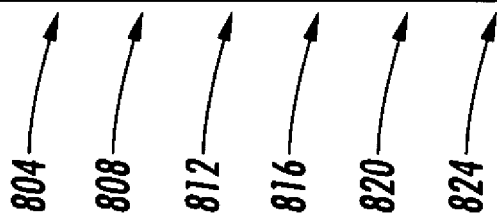
FIG. 8 shows a table that of transverse mode optical confinement factors for a blue laser using the structures of FIG. 3-7.

Row 804 of FIG. 8 shows the transverse mode optical confinement factor of laser structure 300. All the data in FIG. 8 assumes that all modal losses occur from absorption in a Ni/Au p-metal contact and a 460 nm blue laser output. All other layers in the laser were assumed to be approximately loss free. Using those approximations, row 804 shows a confinement factor of 1.27% per quantum well and a loss of 2 per centimeter which compares very favorably with the laser heterostructures described in FIG. 1.

FIG. 4 shows adding a current blocking layer 404 to laser structure 300 to create laser structure 400. The current blocking layer improves electrical confinement in the active region. In FIG. 4, an $Al_{0.1}Ga_{0.9}N$:Mg layer serves as a current blocking layer 404. The current blocking layer or "tunnel barrier layer" is thin, typically on the order of 10-20 nm. Such a thin tunnel barrier layer does not significantly affect the optical confinement and loss. Row 808 of FIG. 8 shows an optical confinement factor of 1.23% and a modal loss of 2 per centimeter cm. The row 808 parameters does not differ significantly from parameters in row 804, confirming the almost negligible optical effects of a thin current blocking layer. The current blocking layer 404 in FIG. 4 may also have a lower or higher aluminum content.

FIG. 5 shows modifying the asymmetric stacked InGaN laser structure 300 into a symmetric structure. The terms asymmetric and symmetric in this context refer to the alloy composition in the lower and upper InGaN waveguide layers. In case of the symmetric structure, the indium mole fractions of the upper and lower InGaN waveguide layers are essentially the same. The asymmetric structure refers to the case when the indium mole fractions of the upper and lower InGaN waveguide layers are essentially different. For example, an asymmetric structure can comprise a GaN waveguide layer on one side and an InGaN waveguide layer on the other side of the active regions.

In FIG. 5, upper GaN:Mg waveguide layer 324 of FIG. 3 has been replaced with an indium gallium nitride content alloy similar to that of lower waveguide layer 316. In particular, FIG. 5 shows an upper waveguide layer 508 that includes 10 percent Indium. Upper waveguide 508 is p doped with magnesium to form a 100 nm thick $In_{0.1}Ga_{0.9}N$:Mg layer. An upper cladding layer 512 is formed over upper waveguide 508.

Surrounding active region 504 with symmetric waveguides improves the symmetric transverse mode output characteristics. Row 812 of FIG. 8 shows the optical confinement and losses associated with symmetric structure 500. Row 812 shows a 1.43% per quantum well confinement factor for the symmetric InGaN laser structure 500 and losses reduced below 1 per centimeter. One difficulty in fabricating structure 500 is lattice mismatches that occur between GaN cladding layer 512 and upper waveguide layer 508.

Figure 6:
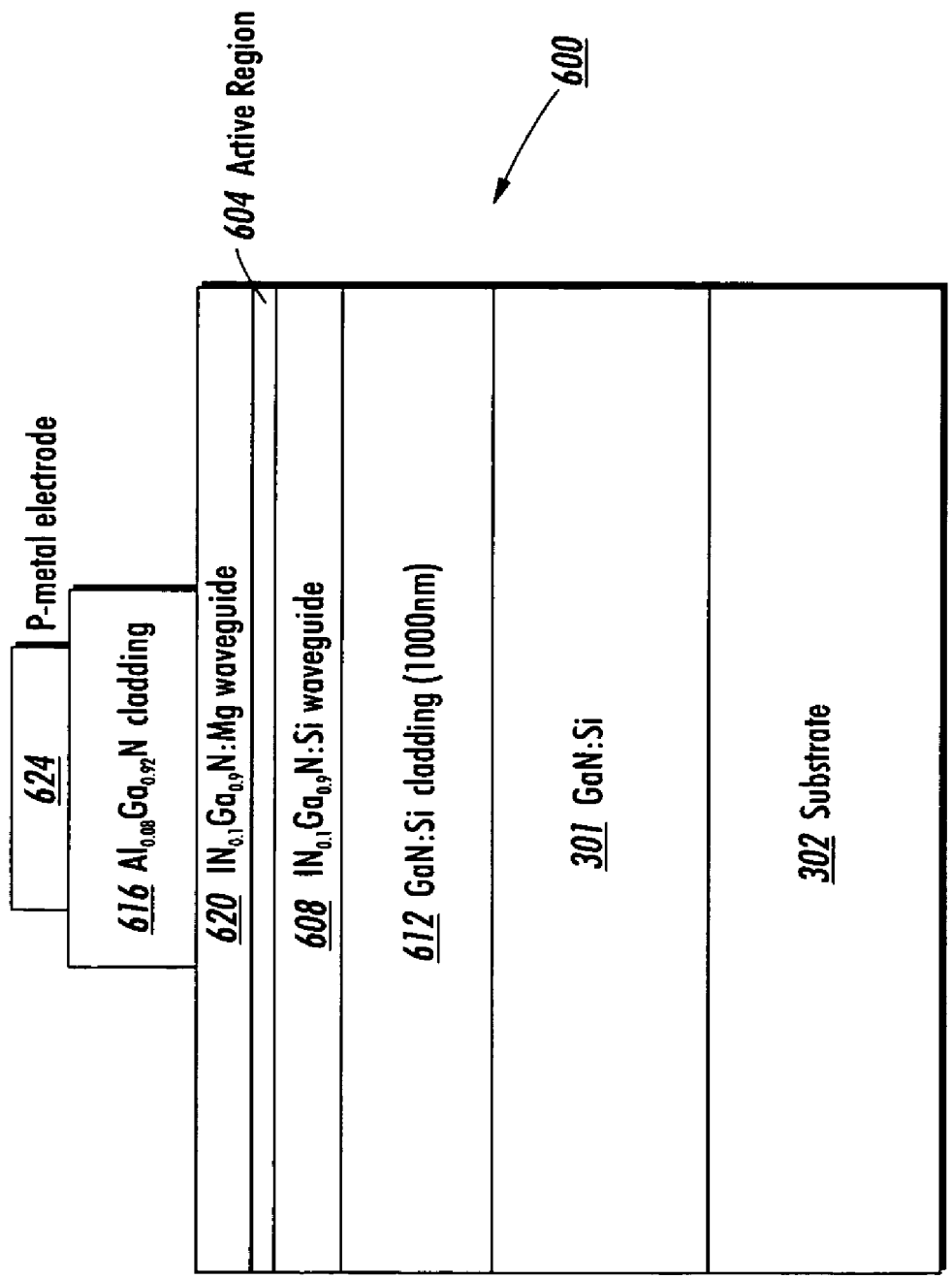
FIG. 6 shows a cross sectional face view of one embodiment of a symmetric stacked InGaN laser structure including a GaN:Si cladding layer.
Figure 7:
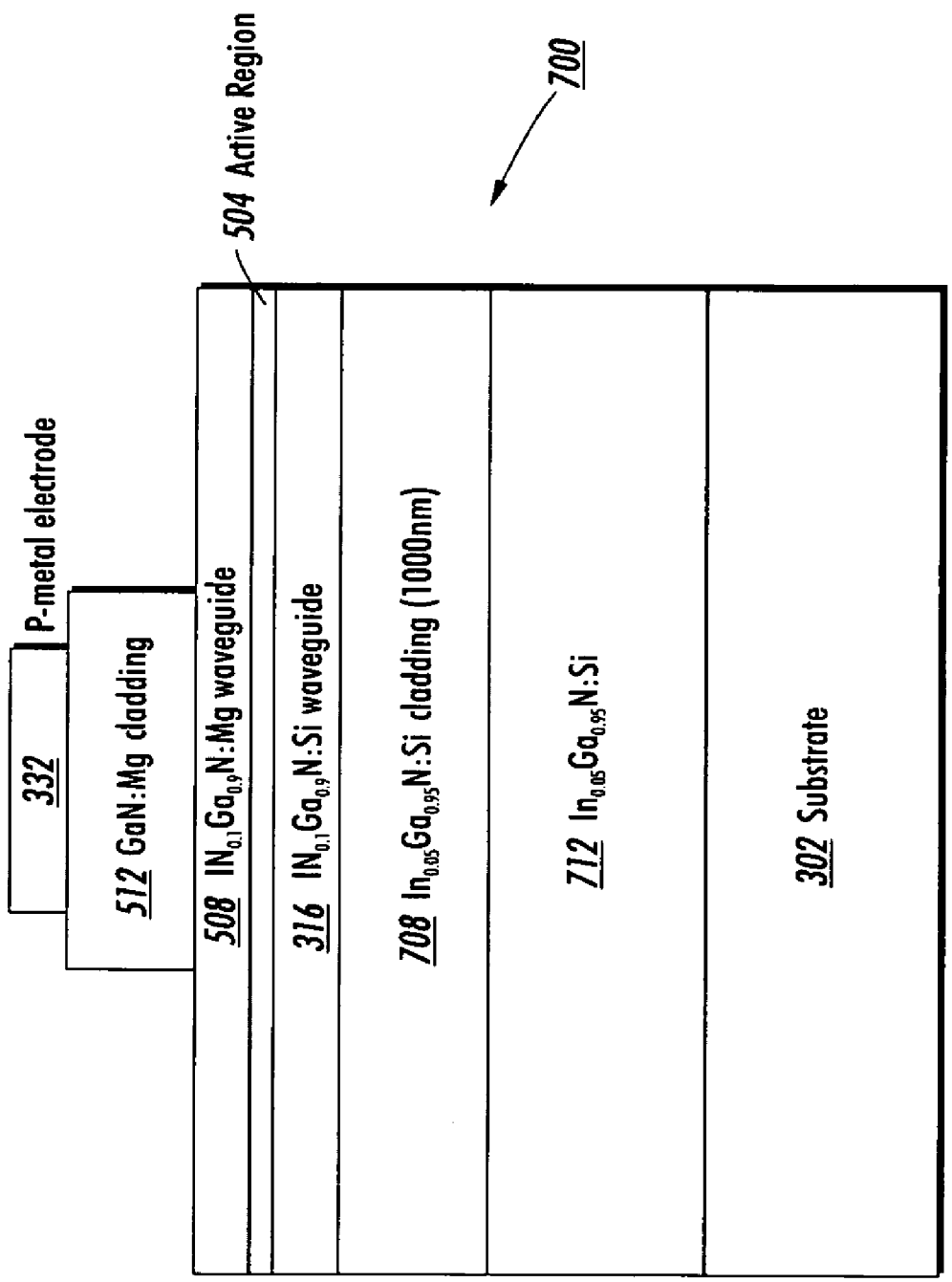
FIG. 7 shows a cross sectional face view of one embodiment of a symmetric stacked InGaN laser structure with a cladding layer that contains indium.

FIGS. 6 and 7 show cladding modifications to the symmetric InGaN laser structure 500 of FIG. 5 to reduce lattice mismatches. FIG. 6 shows forming active region 604 and lower waveguide 608 over a 1000 nm GaN:Si cladding layer 612. A 500 nm upper cladding layer 616 is formed over a 100 nm upper waveguide 620. Upper cladding layer 616 may be made of a magnesium doped AlGaN layer such as $Al_{0.08}Ga_{0.92}N$:Mg. Eliminating aluminum and using GaN:Si in lower cladding layer 608 reduces lattice mismatches between lower waveguide 608 and cladding layer 612. The reduction of lattice mismatches improves the structural quality of the InGaN multiple quantum well epilayers.

Row 816 of FIG. 8 shows confinement factor and losses of laser structure 600. The 1.42% confinement factor and the less than 1 per centimeter loss substantially matches the performance of laser structure 500 of FIG. 5. Thus the improved structural quality comes with only a very minor decrease in confinement factor. However, placing the AlGaN:Mg upper cladding layer 616 adjacent to a p-metal electrode such as Ni/Au contact 624 results in a structure with undesirably high resistivity. High resistivity layers result in high laser operating voltages and excessive heat generation.

Laser structure 700 of FIG. 7 alters both the lower cladding layer 512 as well as the GaN:Si conducting layer 520 of FIG. 5. In FIG. 7, a 1000 nm thick $In_{0.05}Ga_{0.95}N$:Si lower cladding layer 708 is formed over a $In_{0.05}Ga_{0.95}N$:Si conducting buffer layer 712. Matching lower cladding layer 708 materials with buffer conducting layer 712 materials further reduces lattice mismatches and improves the structural quality of the InGaN multiple quantum wells.

Row 820 of FIG. 8 shows the optical confinement and losses associated with laser structure 700 of FIG. 7. The optical confinement factor per quantum well of 1.08% is slightly lower than the confinement factors in laser structure 500 of FIG. 5 and laser structure 600 of FIG. 6. However, in some applications, the improved conductivity and the improved structural characteristics that result from improved lattice matches overcomes the lower confinement factor.

As previously described, the confinement factors shown in FIG. 8 are the confinement factor and modal losses from absorption in a Ni/Au p-metal contact for different devices assuming a 460 nm blue laser structure. Although the computations of FIG. 8 are provided for a blue laser, the structures should not be limited to a blue laser. In fact, the confinement factor and loss parameters improve for a green laser. A green laser active region typically has a higher indium content than a blue laser active region. The higher indium content of the green laser active region results in a larger refractive index differential between the active region and adjacent indium containing optical confinement layers. A larger refractive index differential improves optical confinement.

Figure 12:
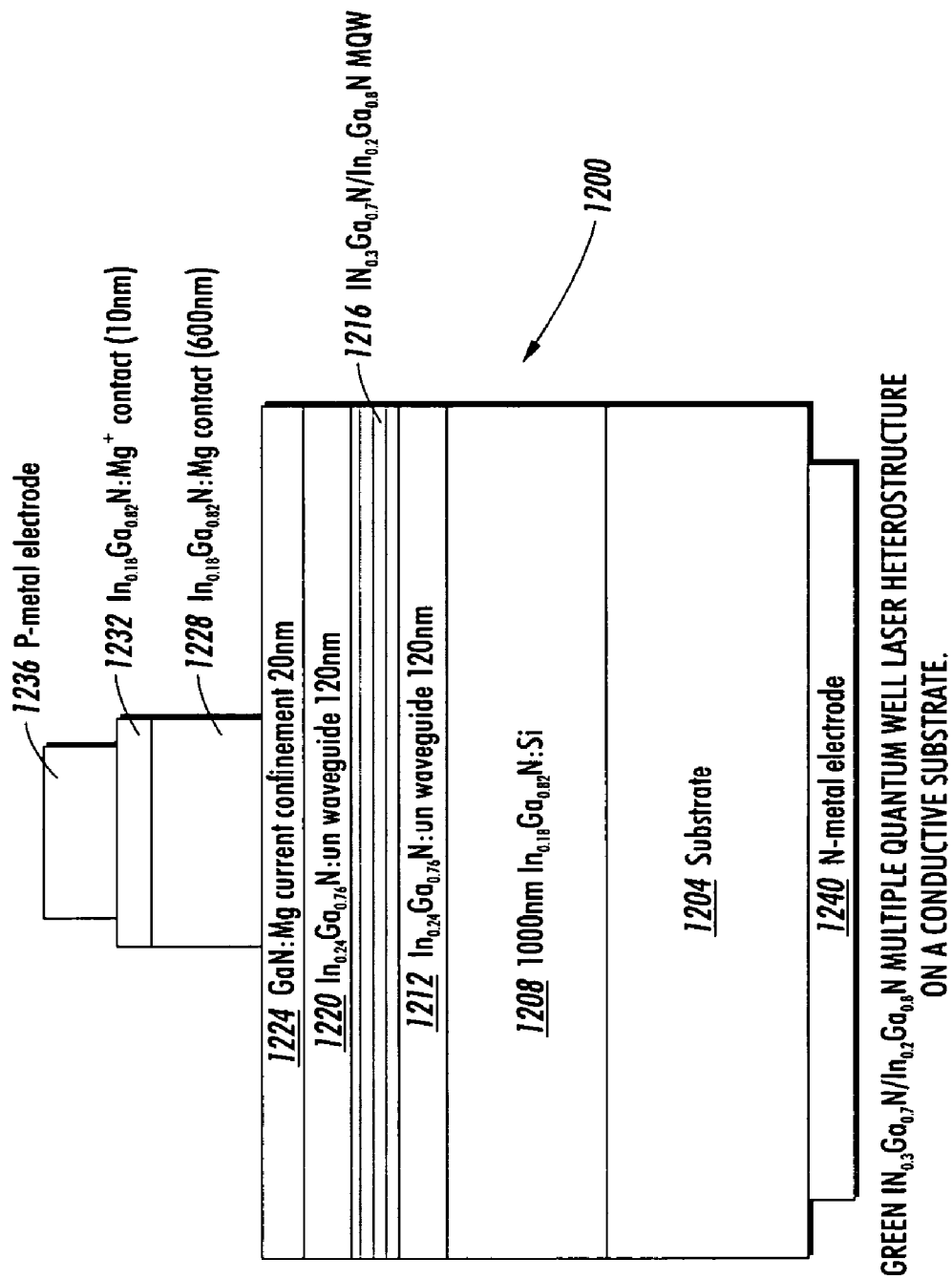
FIG. 12 shows one embodiment of a green laser heterostructure on a conductive substrate.

FIG. 12 shows an example of a green laser heterostructure 1200 for emission at 520 nm. A potential substrate 1204 for such a laser structure could be (0001) ZnO. ZnO has a wurtzite crystal structure and can be made electrically conductive by doping the substrate with gallium or aluminum. ZnO substrates are commercially available. The lattice mismatch between ZnO and GaN is very small (+1.8%) and can be further reduced to almost zero by adding indium to the gallium nitride alloy. InGaN films, with an 18% indium mole fraction of 18% would be approximately lattice-matched to ZnO lattice. This is why an $In_{0.18}Ga_{0.82}N$:Si composition may be chosen for the 1000 nm $In_{0.18}Ga_{0.82}N$:Si cladding layer 1208 in FIG. 12. A 120 nm thick undoped lower $In_{0.24}Ga_{0.76}N$ waveguide layer 1212 is formed over the InGaN:Si cladding layer 1208. The active regions 1216 includes five 2.5 nm thick $In_{0.3}Ga_{0.7}N$ quantum wells surrounded and separated by 6 nm thick $In_{0.2}Ga_{0.8}N$ barriers for emission near 520 nm. An 120 nm thick undoped upper $In_{0.24}Ga_{0.76}N$ waveguide layer 1220 is formed over the active region. A 20 nm thick Mg-doped GaN current confinement layer 1224 is grown on top of the upper waveguide layer 1220. A 600 nm thick Mg-doped $In_{0.18}Ga_{0.82}N$ cladding layer 1228 is deposited over current confinement layer 1224. Cladding layer 1228 is capped by a 10 nm highly Mg-doped $In_{0.18}Ga_{0.82}N$ contact layer 1232. FIG. 12 shows P-electrode 1236 and n-electrodes 1240 are deposited on the top and base of the laser heterostructure as shown in FIG. 12 and described above.

One exemplary advantage of this lattice matching of the laser heterostructure is that the cladding and waveguide layers are fairly well lattice matched to the substrate, which reduces the risk of defect generation during epitaxial growth. The illustrated structure 1200 is particularly suitable for green or longer wavelength laser structures because the preferred indium composition for a green or longer wavelength laser heterostructure approximately matches the optimal indium composition range for the lattice matching of InGaN alloys to substrates such as ZnO. Note that this laser structure contains no aluminum in any of the layers. The absence of aluminum allows growing of these layers at lower temperatures (e.g. 500-900 degrees Celsius) which is beneficial for enhancing the incorporation of indium. A calculation of the transverse mode optical confinement factor and modal loss calculations in the laser structure yields a confinement factor of 0.56% per quantum well and a loss of 1.2 per centimeter. The lower optical confinement factor is due to the smaller refractive index steps between the waveguide layer, cladding layer and active region and due to the thinner quantum wells. Nevertheless, increasing the number of quantum wells to five compensates for the reduced optical confinement of the structure and would still provide sufficient modal gain.

In the various embodiments described, many details have been provided including example compositions of the various layers, example wavelengths of laser output, example thicknesses of layers and a multitude of other details. It should be understood that these details are intended to provide example implementations and to facilitate understanding of the invention. These details should not limit the scope of the invention. Instead, the invention should only be limited by the claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A semiconductor laser having an asymmetric stack of wavequide layers, comprising:
    an active region including at least one quantum well containing indium, gallium, and nitride, the active region having a first side and a second side;
    a first waveguide layer immediate adjacent to the first side, said first wavequide layer comprising a nitride of indium (In) and gallium (Ga) in the ratio of $In_yGa_{1-y}N$, where y>0, said first waveguide layer being essentially free of aluminum;
    a first cladding layer having a refractive index less than a refractive index of the active region, the first cladding layer adjacent the first waveguide layer, the first cladding layer consisting of gallium nitride, the first cladding layer to provide optical confinement such that an output of the semiconductor laser is directed in a direction approximately parallel to a plane of an interface between the first cladding layer and the first waveguide layer;
    a second waveguide layer adjacent to the second side, said second waveguide layer comprising a nitride of indium (In) and gallium (Ga) in the ratio of $In_xGa_{1-x}N$, where x>0, said second waveguide layer being essentially free of aluminum; and
    a second cladding layer adjacent the second waveguide layer, the second cladding layer consisting essentially of a nitride of aluminum (Al) and gallium (Ga), the second cladding layer to provide optical confinement such that an output of the semiconductor laser is directed in a direction approximately parallel to a plane of an interface between the second cladding layer and the second waveguide layer.

2. The semiconductor laser of claim 1 wherein the first cladding layer is at least 20 nm thick.

3. The semiconductor laser of claim 1 further comprising:
    a thin current barrier layer between and in physical contact with the active region and the second waveguide layer.

4. The semiconductor laser of claim 3 wherein the current barrier layer is magnesium (Mg) doped.

5. The semiconductor laser of claim 4 wherein the current confinement layer is between 5 nm and 40 nm.

* * * * *